(12) United States Patent
Shrestha et al.

(10) Patent No.: US 11,846,689 B2
(45) Date of Patent: Dec. 19, 2023

(54) RF RECEIVER SYSTEM WITH ADJUSTABLE IMPEDANCE MATCHING

(71) Applicant: KONINKLIJKE PHILIPS N.V., Eindhoven (NL)

(72) Inventors: Rameswor Shrestha, Eindhoven (NL); Filips van Liere, Best (NL); Sotir Filipov Ouzounov, Eindhoven (NL); Emil Dimitrov Totev, Eindhoven (NL); Pol Ketan Jayant, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 66 days.

(21) Appl. No.: 17/487,283

(22) Filed: Sep. 28, 2021

(65) Prior Publication Data

US 2022/0107375 A1    Apr. 7, 2022

(30) Foreign Application Priority Data

Oct. 1, 2020    (EP) ..................... 20199493

(51) Int. Cl.
*G01R 33/36* (2006.01)
*H03F 1/56* (2006.01)
*H03F 3/19* (2006.01)

(52) U.S. Cl.
CPC ..... *G01R 33/3621* (2013.01); *G01R 33/3614* (2013.01); *H03F 1/565* (2013.01); *H03F 3/19* (2013.01); *H03F 2200/222* (2013.01); *H03F 2200/451* (2013.01)

(58) Field of Classification Search
CPC ............ G01R 33/3621; G01R 33/3614; G01R 33/341; G01R 33/3628; H03F 1/565; H03F 3/19; H03F 2200/222; H03F 2200/451
See application file for complete search history.

(56) References Cited

U.S. PATENT DOCUMENTS

| | | |
|---|---|---|
| 5,450,011 A | 9/1995 | Boeijen |
| 5,545,999 A | 8/1996 | Mueller |
| 8,922,212 B2 | 12/2014 | Findeklee |

(Continued)

OTHER PUBLICATIONS

Sporrer, B. et al., "A fully integrated dual channel on-coil CMOS receiver for array coils". IEEE Trans. Biomed. Circ. and Syst. 11(2017)1245-1255.

*Primary Examiner* — Susan S Lee

(57) ABSTRACT

A RF receiver system for an MRI apparatus includes a receive coil, which exhibits a total effective coil impedance composed of the coil impedance of the coil itself and a patient impedance. An analog-to-digital converter is connected to an amplifier for converting the amplified output signal from the amplifier to a digital signal for further processing. A matching network is interconnected between the receive coil and the amplifier and includes a matching system with an adjustable impedance for matching the total effective coil impedance to the lowest noise impedance, and a noise calculation unit is connected to the analog-to-digital converter for receiving the digital output signal of the converter and is configured to calculate noise of the output signal of the analog-to-digital converter and for adjusting the adjustable impedance of the matching network in order to calibrate the matching network for every patient individually before the scanning process.

13 Claims, 3 Drawing Sheets

(56) References Cited

U.S. PATENT DOCUMENTS

| | | | |
|---|---|---|---|
| 2011/0057654 A1* | 3/2011 | Sun | G01R 33/3628 324/318 |
| 2014/0203804 A1 | 7/2014 | Duensing | |
| 2017/0359034 A1 | 12/2017 | Haefner | |
| 2020/0158801 A1 | 5/2020 | Che | |

* cited by examiner

RF RECEIVER SYSTEM WITH ADJUSTABLE IMPEDANCE MATCHING

CROSS-REFERENCE TO RELATED APPLICATIONS

This patent application claims the priority benefit under 35 U.S.C. § 119(e) of European Patent Application No. 20199493.6, filed on Oct. 1, 2020, the contents of which are herein incorporated by reference.

FIELD OF THE INVENTION

The invention relates to the field of magnetic resonance imaging (MRI), and in particular to the field of radio frequency receiver systems for a magnetic resonance imaging (MRI) apparatus.

BACKGROUND OF THE INVENTION

A part of every MRI apparatus is the receiver system for receiving and converting the MRI signal. In general, a receiver system comprises a radio frequency (RF) receive coil, a matching network, a low noise amplifier and an analog-to-digital converter (ADC). The precession of the net magnetization induces a current in the RF receive coil via electromagnetic induction. The low-noise amplifier (LNA), increases the amplitude of the received signal so that it can be digitized subsequently by the ADC and processed to form an image. Thereby, the most important requirement is to achieve the minimum noise fig. (NF). The lowest NF is achieved if the source impedance is transformed and matched to the best noise impedance of the LNA. The RF receive coil is a piece of a conductive wire with an inductance and a coil resistance. If the RF receive coil is loaded with a patient, the total resistance of the RF receive coil changes to be the sum of the RF receive coil resistance and the patient's resistance. However, conventional matching networks of RF receiver systems are designed to match for only a specific impedance. Therefore, for such systems image quality cannot be held at a constant level since the NF and hence the signal-to-noise ratio (SNR) differs from patient to patient.

The paper '*A fully integrated dual channel on-coil CMOS receiver for array coils*' in IEEE Trans. Biomed. Circ. and Syst. 11(2017)1245-1255 by B. Sporrer et al. This on-board coil CMOS receiver array has both the capacitance and the inductance of the matching circuits intergrated with the amplifier and the (implicit) noise calculation.

SUMMARY OF THE INVENTION

Hence, it is an object of the invention to provide a RF receiver system for a patient-specific tuning of the matching network.

According to the invention, this object is addressed by the subject matter of the independent claims. The matching network comprises a capacitive portion with at least one capacitor or several capacitors. The matching the amplifier is integrated with the matching network's capacitive portion and the noise calculation unit. Preferred embodiments of the invention are described in the sub claims.

Therefore, according to the invention, a radio frequency receiver system for an MRI apparatus is provided, wherein the radio frequency system comprises a receive coil for being arranged in position to receive magnetic resonance signals, e.g. attached to or mounted relative to a patient which is to be examined by the MRI apparatus and which in such a state in which it is attached to the patient exhibits a total effective coil impedance which is composed of the coil impedance of the coil itself and the patient impedance due to the patient to whom the coil is attached, an amplifier which exhibits the lowest noise impedance and which is connected to the receive coil for amplifying a signal received from the receive coil and outputting an amplified output signal, an analog-to-digital converter which is connected to the amplifier for converting the amplified output signal from the amplifier to a digital signal for further processing, a matching network which is interconnected between the receive coil and the amplifier and which comprises a matching system with an adjustable impedance for matching the total effective coil impedance to the lowest noise impedance, and a noise calculation unit which is connected to the analog-to-digital converter for receiving the digital output signal of the analog-to-digital converter and which is adapted for calculating the noise of the output signal of the analog-to-digital converter and for adjusting the adjustable impedance of the matching network.

As explained further above, the RF receive coil is a piece of a conductive wire with an inductance and a coil resistance which, if loaded with a patient, changes to a total effective coil impedance which is a combination of the RF receive coil resistance and the patient's resistance. According to the present invention it has been realized that patient's resistance, which is dependent on the patient, varies in a very broad range, i.e. typically from $0.1\Omega$ to $30\Omega$. This fact is addressed by the invention by avoiding a fixed impedance of the matching network which only aims to provide a "typical" average matching impedance. Rather, the invention provides the possibility of adapting the matching network for every patient individually prior to the scanning process.

The impedance seen by the amplifier can be adapted to the best point for a large range of source impedances. Hence, "matching the total effective coil impedance to the lowest noise impedance" means that the matching system converts the total effective coil impedance in order to approximate the combination of the effective coil impedance and the adjustable impedance of the matching network to the lowest noise impedance of the amplifier. In this respect, the term "lowest noise impedance" refers to the impedance which provides the lowest noise fig. by the amplifier. Hence, the invention aims to match the individual patient impedance to the impedance that provide the lowest noise fig. by the amplifier.

The noise calculation unit gets the digital signal from the ADC and then generates the digital bits to adjust the matching network to the best lowest noise impedance. The term "best" means in that case, that the noise floor's level is below a target noise fig. which is preferably 1 dB. For this purpose, the noise floor is calculated from the ADC bit stream. The (digital) noise floor represents the output of the ADC when there is zero input signal. This can be done by simply calculating a standard deviation of the noise.

The functionality of the invention is independent of the LNA configuration.

The invention may also be a solution to automatically tune the ultra-flexible and adaptive RF coils that may be the coils of the future.

According to a preferred embodiment of the invention, the amplifier of the radio frequency receiver system is a low-noise amplifier. A low-noise amplifier (LNA) is an electronic amplifier that is able of amplifying a very low-power signal without significantly degrading its signal-to-noise ratio. An amplifier will increase the power of both the signal and the noise present at its input, but the amplifier will also introduce some additional noise. LNAs are designed to minimize that additional noise. Preferred LNAs for the present application may supply a power gain of 100 (20 decibels (dB)) while decreasing the signal-to-noise ratio by less than a factor of two (a 3 dB noise fig. (NF)). Most preferred is a NF of less than 0.5 dB for the LNA.

According to a preferred embodiment of the invention, the matching system comprises an adjustable capacitor bank, preferably with target range and resolution. Via the capacitor bank it is possible to tune the matching network by deducing the noise fig. (NF) of the ADC data output and to configure the matching network to the best impedance before the scanning process.

In general, different types of capacitor banks may be used for the invention. According to a preferred embodiment of the invention, the capacitor bank is a monolithically integrated capacitor bank. A capacitor bank is a grouping of several identical capacitors interconnected in parallel or in series with one another.

According to a preferred embodiment of the invention, the matching system, the amplifier and the analog-to-digital converter are integrated on a monolithic die. The matching capacitor of the matching system, the amplifier and the ADC are mounted on the same monolithic die, also named "on-chip". The most important parts for calibrating the matching network for every patient individually are integrated on the same chip and can be easily installed.

Further, according to a preferred embodiment of the invention, the matching network further comprises at least one capacitor, preferably two capacitors, which are separate from the monolithic die, named "off-chip". The capacitors are arranged in such a way, that a first capacitance is the sum of the capacitance of the on-chip capacitor and the at least one off-chip capacitor. A second capacitance is the sum of a second on-chip capacitor and a second off-chip capacitor. If the ratio of the first capacitance to the second capacitance is varied, so that the sum of the first and the second capacitance is constant, the best noise impedance travels along the resistive axis as a function of the first capacitance divided by the second capacitance. This may provide an even better matched impedance for each source impedance with only slightly added costs and complexity.

In general, different types of capacitors may be used for the invention. According to a preferred embodiment of the invention, the at least one capacitor which is separate from the monolithic die comprises a fixed capacitance.

Further, according to the invention, a method for operating a radio frequency receiver system for an MRI apparatus is provided. The method comprises the following method steps: attaching a receive coil to a patient which is to be examined by the MRI apparatus wherein the receive coil exhibits a total effective coil impedance which is composed of the coil impedance of the coil itself and the patient impedance due to the patient to who the coil is attached, receiving a signal from the receive coil by an amplifier which exhibits the lowest noise impedance, amplifying the signal received from the receive coil by the amplifier, outputting an amplified output signal from the amplifier to an analog-to-digital converter, converting the amplified output signal from the amplifier to a digital signal for further processing in the analog-to-digital converter, and matching the total effective coil impedance to the lowest noise impedance by a matching network which is interconnected between the receive coil and the amplifier and which comprises a matching system with an adjustable impedance. "Matching" in this context means "approximating", i.e. it is intended to make the difference between the impedances small, preferably smaller than a predefined threshold value. Preferably, the receive coil comprises multiple receive channels with their own amplifier and matching network, and the method is performed for all these receive channels.

According to a preferred embodiment of the invention, the method further comprises the method step of: receiving the digital output signal of the analog-to-digital converter by a noise calculation unit, and adjusting the adjustable impedance and then calculating the noise of the output signal of the analog-to-digital converter at each impedance point. The noise calculation unit then calculates the best lowest noise impedance. "Best" means in that case, that the noise floor's level is as lower than a predefined threshold level.

According to a preferred embodiment of the invention, the method further comprises the method step of: adjusting the adjustable impedance by varying the ratio between a first adjustable impedance of a first capacitor and a second adjustable impedance of a second capacitor. The capacitance of first matching capacitor and the capacitance of the second matching capacitor are tuned for achieving the best impedance, in such a way that the sum of the capacitance of the first matching capacitor and the capacitance of the second matching capacitor is constant.

This adjusting may be done in different ways. According to a preferred embodiment of the invention, the adjusting of the adjustable impedance is controlled automatically. The adjusting is controlled digitally, so that the user does not need to have any specific knowledge regarding the implementation.

Further, according to the invention, a non-transitory computer-readable medium is provided which comprises instructions stored thereon, that when executed on a processor induce a radio frequency receiver system for an MRI apparatus to perform a method as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
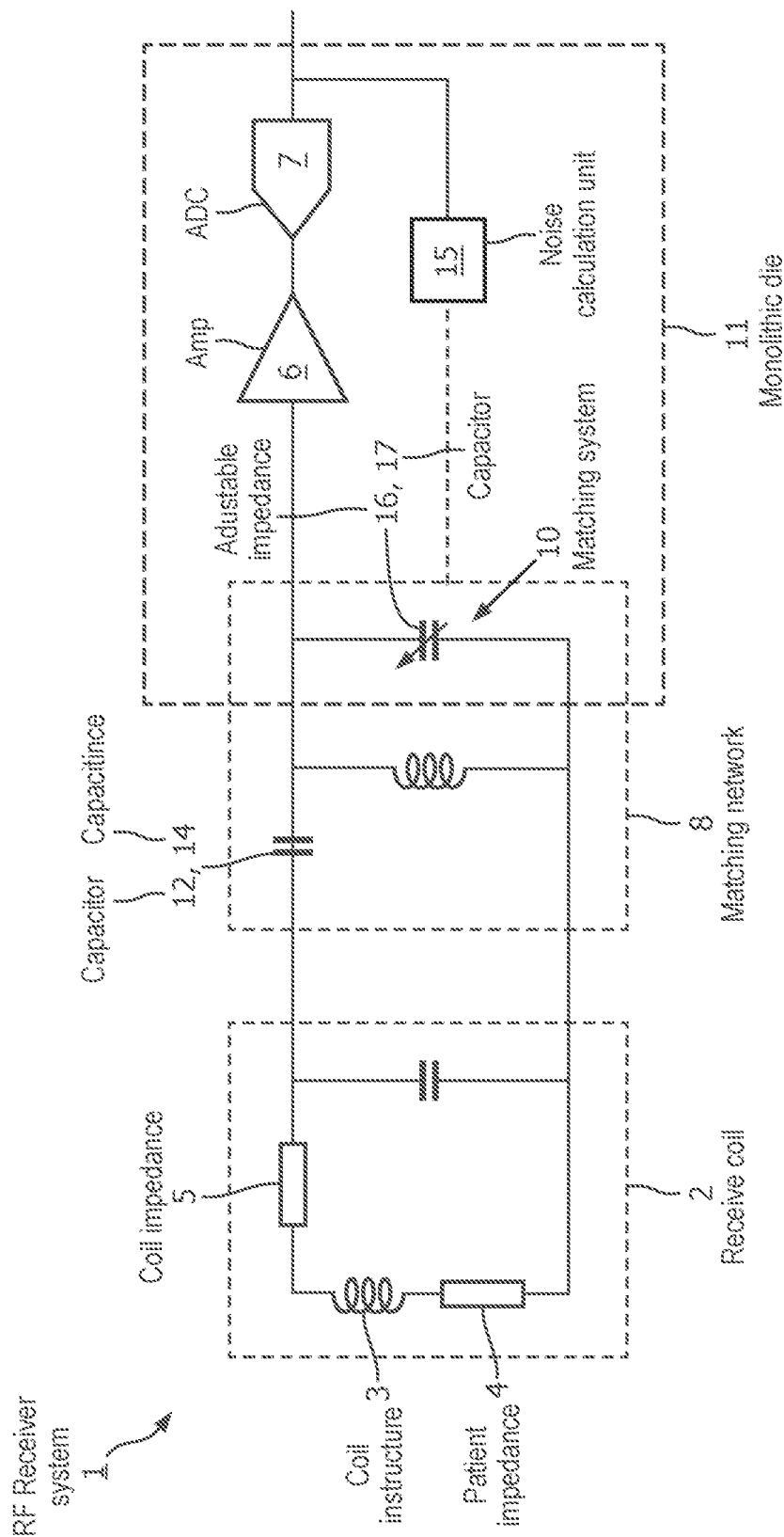
FIG. 1 schematically depicts a RF receiver system according to a preferred embodiment of the invention.

FIG. 1 schematically depicts a RF receiver system 1 according to a preferred embodiment of the invention. The RF receiver system 1 comprises a receive coil 2, wherein the receive coil 2 comprises the coil inductance 3, the patient impedance 4 and the coil impedance 5. The patient impedance 4 varies from patient to patient, typically in a range from 0.1Ω to 30Ω. A second part of the RF receiver system 1 is the matching network 8. The matching network 8 comprises a capacitor 12 separated from the monolithic die 11, a so called "off-chip" capacitor and a matching system 10, wherein the matching system 10 comprises another capacitor 17 with an adjustable impedance 16. The capacitor 17 is integrated on the monolithic die, and is also named an "on-chip" capacitor. In addition to the "on-chip" capacitor 17 further components are integrated on the monolithic die 11. The amplifier 6, that is a low-noise amplifier (LNA) with the lowest noise impedance and the analog-to-digital converter 7 are also integrated on the monolithic die 11. The LNA 6 and the ADC 7 are arranged in such a way that the ADC 7 receives the signal from the LNA 6. The noise calculation unit 15 is also integrated on the monolithic die 11 and is arranged in such a way that it receives the digital signal from the ADC 7 and adjusts the adjustable impedance 16 of the "on-chip" capacitor 17, so that the noise floor's level of the LNA 6 is as low as achievable. Thus, the capacitor 17 with the adjustable impedance 16, the LNA 6, the ADC 7 and the noise calculation unit 15 are integrated on the same monolithic die 11.

Figure 2:
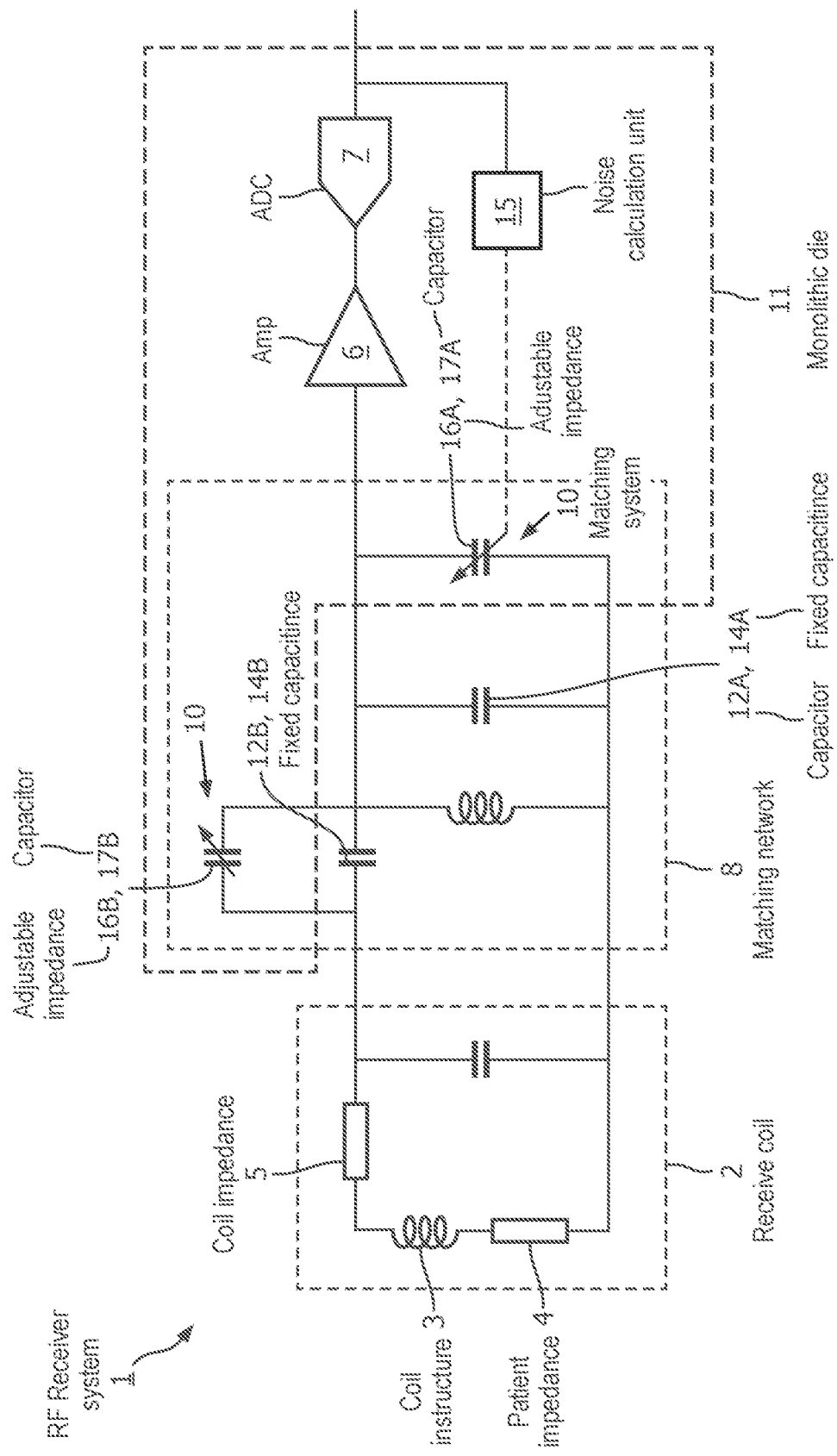
FIG. 2 schematically depicts a second RF receiver system according to a preferred embodiment of the invention.

FIG. 2 schematically depicts a second RF receiver system 1 according to a preferred embodiment of the invention. The receive coil 2 is identical to the receive coil 2 of FIG. 1. The matching network 8 now comprises instead of one "on-chip" capacitor 17 and one "off-chip" capacitor 12 a first and a second combined capacitance. The first combined capacitance is the sum of a first capacitor 17A with a first adjustable impedance 16A and a first capacitor 12A separated from the monolithic die 11 with a fixed capacitance 14. The second combined capacitance is the sum of a second capacitor 17B with a second adjustable impedance 16B and a second capacitor 12B separated from the monolithic die 11 with a fixed capacitance 14. The first capacitor 17A and the second capacitor 17B with adjustable impedances 16A, 16B are integrated on the monolithic die 11, while the first capacitor 12A and the second capacitor 12B are separated from the monolithic die 11. The LNA 6, the ADC 7 and the noise calculation unit 15 are also integrated on the monolithic die 11. Instead of adjusting only one impedance 16, it is now possible with the preferred embodiment of the invention shown in FIG. 2, to adjust the ratio of the first summed impedance 16A+14A to the second summed impedance 16B+14B. The sum of the first 16A+14A and the second 16B+14B summed impedance is constant, so that the best noise impedance travels along the resistive axis as a function of the first summed impedance 16A+14A divided by the second summed impedance 16B+14B. This may provide an even better matched best impedance for each source impedance with slightly added cost of complexity.

Figure 3:
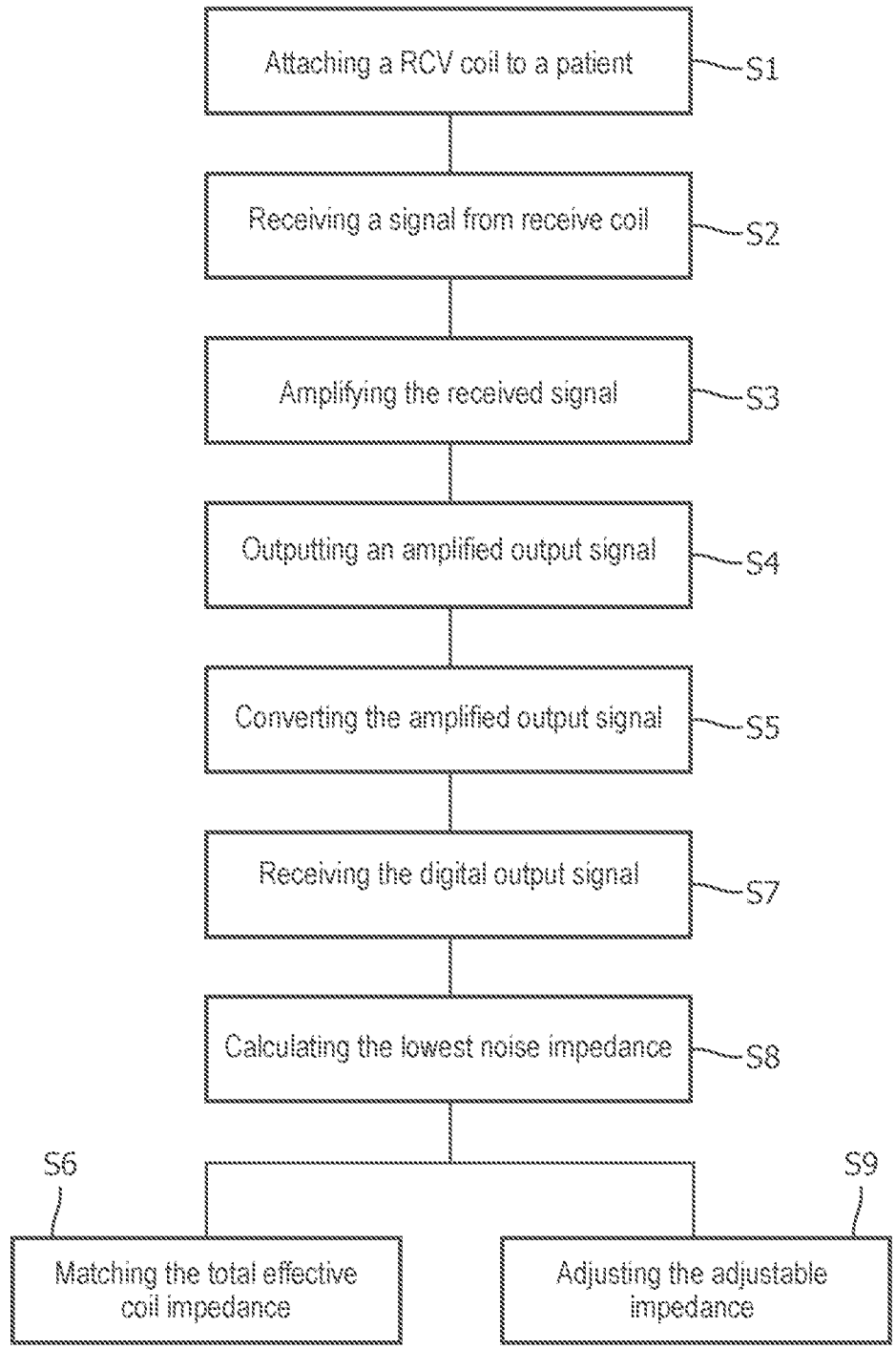
FIG. 3 schematically depicts a scheme of a method according to a preferred embodiment of the invention.

FIG. 3 schematically depicts a scheme of a method according to a preferred embodiment of the invention.

S1: First, a receive coil 2 is attached to a patient. The patient is to be examined by the MRI apparatus. The receive coil 2 impedance is the sum of the coil impedance 5 and the patient impedance 4 to who the receive coil 2 is attached to for examination.

S2: Second, a signal from the receive coil 2 is received by an amplifier 6, for example an LNA 6 with the lowest noise impedance.

S3: Third, the received signal is amplified by the amplifier 6.

S4: Fourth, the amplified signal is outputted by the amplifier 6 to an ADC 7.

S5: Fifth, the amplified output signal is converted from being analog to digital by the ADC 7.

S7: Sixth, the digital output signal of the ADC 7 is received by a noise calculation unit 15.

S8: Seventh, the noise calculation unit 15 calculated the best lowest noise impedance by deducing the noise of the output signal of the ADC 7, so that the noise floor's level is as low as achievable.

In dependence of the embodiment of the invention, if the matching network comprises only one adjustable impedance 16 or a combination of a first 16A and a second 16B adjustable impedance, the next step is either S6: Matching the total effective coil impedance, thus the combination of the patient impedance 4 and the coil impedance 5, to the lowest noise impedance by the matching network 8 with a matching system 10 with an adjustable impedance 16. "Matching" means that the adjustable impedance 16 is adjusted to that the adjustable impedance 16 corresponds with the lowest noise impedance; or S9: Matching the total effective coil impedance by adjusting varying the ratio between the first adjustable impedance 16A of a first "on-chip" capacitor 17A and the second adjustable impedance 16B of a second "on-chip" capacitor 17B.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST radio frequency receiver system 1
receive coil 2
coil inductance 3
patient impedance 4
coil impedance 5
amplifier, LNA 6
analog-to-digital converter 7
matching network 8
matching system 10
monolithic die 11
capacitor separated from the monolithic die 12
first capacitor separated from the monolithic die 12A
second capacitor separated from the monolithic die 12B
fixed capacitance 14
first fixed capacitance 14A
second fixed capacitance 14B
noise calculation unit 15
adjustable impedance 16
first adjustable impedance 16A
second adjustable impedance 16B
capacitor 17
first capacitor 17A
second capacitor 17B
attaching a receive coil to a patient S1
receiving a signal from the receive coil by an amplifier S2
amplifying the signal received from the receive coil S3
outputting an amplified output signal from the amplifier S4
converting the amplified output signal from the amplifier S5
matching the total effective coil impedance S6
receiving the digital output signal S7 calculating the lowest noise impedance S8 adjusting the adjustable impedance S9

The invention claimed is:

1. A radio frequency receiver system for an MRI apparatus, comprising:
   a receive coil for being attached to a patient which is to be examined by the MRI apparatus and which in such a state in which it is attached to the patient exhibits a total effective coil impedance which is composed of the coil impedance of the coil itself and the patient impedance due to the patient to who the coil is attached,
   an amplifier which exhibits a lowest noise impedance and which is connected to the receive coil for amplifying a signal received from the receive coil and outputting an amplified output signal,
   an analog-to-digital converter which is connected to the amplifier for converting the amplified output signal from the amplifier to a digital signal for further processing,
   a matching network which is interconnected between the receive coil and the amplifier and which comprises a matching system with an adjustable impedance for matching the total effective coil impedance to the lowest noise impedance, the matching network further comprising a capacitive portion with at least one capacitor, or several capacitors, and
   a noise calculation unit which is connected to the analog-to-digital converter for receiving a digital output signal of the analog-to-digital converter and which is adapted for calculating a noise of the output signal of the analog-to-digital converter, determining the lowest noise and for adjusting the adjustable impedance of the matching network, and wherein the amplifier is integrated with the matching network's capacitive portion and the noise calculation unit.

2. The radio frequency receiver system of claim 1, wherein the amplifier is a low-noise amplifier.

3. The radio frequency receiver system of claim 1, wherein matching network's capacitive portion comprises an adjustable capacitor bank.

4. The radio frequency receiver system of claim 1, wherein the capacitor bank is a monolithically integrated capacitor bank.

5. The radio frequency receiver system of claim 1, wherein the matching network's capacitive portion, the amplifier and the analog-to-digital converter are integrated on a monolithic die.

6. The radio frequency receiver system of claim 1, wherein the matching network further comprises at least one inductor.

7. The radio frequency receiver system of claim 6, wherein the at least one capacitor which is separate from the monolithic die has a fixed capacitance.

8. The radio frequency receiver system of claim 6, wherein the matching network further comprises a capacitor separate from a monolithic die.

9. A method for operating a radio frequency receiver system for an MRI apparatus, wherein a receive coil exhibits a total effective coil impedance which is composed of the coil impedance of the coil itself and a patient impedance due a patient which is to be examined by the MRI apparatus and with respect to whom the coil is arranged, the method comprising the following method steps:
   receiving a signal from the receive coil by an amplifier which exhibits an impedance-,
   amplifying the signal received from the receive coil by the amplifier,
   outputting an amplified output signal from the amplifier to an analog-to-digital converter,
   converting the amplified output signal from the amplifier to a digital signal for further processing in the analog-to-digital converter, and
   matching the total effective coil impedance to a lowest noise impedance by a matching network which is interconnected between the receive coil and the amplifier and which comprises a matching system with an adjustable impedance.

10. The method of claim 9, wherein the method further comprises the method steps of: receiving a digital output signal of the analog-to-digital converter by a noise calculation unit, and calculating a noise of the output signal of the analog-to-digital converter.

11. The method of claim 9, wherein the method further comprises the method step of: adjusting the adjustable impedance by varying a ratio between a first adjustable impedance of a first capacitor and a second adjustable impedance of a second capacitor.

12. The method of claim 9, wherein the adjusting of the adjustable impedance is controlled automatically.

13. A non-transitory computer-readable medium, comprising instructions stored thereon, that when executed on a processor induce a radio frequency receiver system for an MRI apparatus to perform a method according to claim 9.

* * * * *